United States Patent
Nieh et al.

(10) Patent No.: US 9,520,327 B2
(45) Date of Patent: *Dec. 13, 2016

(54) METHODS OF FORMING LOW RESISTANCE CONTACTS

(71) Applicant: Taiwan Semiconductor Manufacturing Company Limited, Hsinchu (TW)

(72) Inventors: Chun-Wen Nieh, Hsinchu County (TW); Hung-Chang Hsu, Kaohsiung (TW); Wei-Jung Lin, Taipei (TW); Yan-Ming Tsai, Miaoli County (TW); Chen-Ming Lee, Taoyuan County (TW); Mei-Yun Wang, Hsin-Chu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/883,935

(22) Filed: Oct. 15, 2015

(65) Prior Publication Data

US 2016/0035629 A1    Feb. 4, 2016

Related U.S. Application Data

(63) Continuation of application No. 14/190,226, filed on Feb. 26, 2014, now Pat. No. 9,165,838.

(51) Int. Cl.
*H01L 27/095* (2006.01)
*H01L 21/8238* (2006.01)
(Continued)

(52) U.S. Cl.
CPC ..... *H01L 21/823871* (2013.01); *H01L 21/283* (2013.01); *H01L 21/28518* (2013.01);
(Continued)

(58) Field of Classification Search
CPC .... H01L 27/095; H01L 29/517; H01L 29/665; H01L 29/7839; H01L 21/28167; H01L 21/28211; H01L 21/28525; H01L 21/761; H01L 21/76895; H01L 21/8213; H01L 21/823481; H01L 21/823807
(Continued)

(56) References Cited

U.S. PATENT DOCUMENTS 8,110,877 B2    2/2012  Mukherjee et al.
2003/0235936 A1*  12/2003  Snyder ............... H01L 29/7839
                                                        438/92
(Continued)

*Primary Examiner* — William F Kraig
*Assistant Examiner* — Edward Chin
(74) *Attorney, Agent, or Firm* — Jones Day

(57) ABSTRACT

Methods for forming electrical contacts are provided. First and second FETs are formed over a semiconductor substrate. Openings are etched in a dielectric layer formed over the substrate, where the openings extend to source and drain regions of the FETs. A hard mask is formed over the source and drain regions of FETs. A first portion of the hard mask is removed, where the first portion is formed over the source and drain regions of the first FET. First silicide layers are formed over the source and drain regions of the first FET. A second portion of the hard mask is removed, where the second portion is formed over the source and drain regions of the second FET. Second silicide layers are formed over the source and drain regions of the second FET. A metal layer is deposited within the openings to fill the openings.

20 Claims, 10 Drawing Sheets

(51) Int. Cl.
    *H01L 21/283* (2006.01)
    *H01L 27/092* (2006.01)
    *H01L 29/45* (2006.01)
    *H01L 29/417* (2006.01)
    *H01L 29/66* (2006.01)
    *H01L 21/285* (2006.01)
    *H01L 21/768* (2006.01)

(52) U.S. Cl.
    CPC .. *H01L 21/76843* (2013.01); *H01L 21/76855* (2013.01); *H01L 27/092* (2013.01); *H01L 29/41725* (2013.01); *H01L 29/45* (2013.01); *H01L 29/456* (2013.01); *H01L 29/665* (2013.01)

(58) Field of Classification Search
    USPC ................................. 257/E27.068, E29.271, E21.061, 257/E21.193, E21.4, E21.425, E21.438, 257/E21.618, E21.619, E21.623, E29.055, 257/E29.056, E29.059, E29.148, E29.162, 257/E29.165, E29.265, E29.312, 267, 272, 471, 257/485; 438/186, 230, 276, 571, 580, 581, 438/653, 92

See application file for complete search history.

(56) References Cited

U.S. PATENT DOCUMENTS

| | | | |
|---|---|---|---|
| 2004/0038466 A1* | 2/2004 | Yen | H01L 21/28194 438/197 |
| 2004/0041226 A1* | 3/2004 | Snyder | H01L 27/095 257/471 |
| 2006/0220141 A1* | 10/2006 | Besser | H01L 21/28518 257/371 |
| 2007/0001233 A1* | 1/2007 | Schwan | H01L 21/28518 257/369 |
| 2007/0141798 A1 | 6/2007 | Bohr | |
| 2008/0272408 A1* | 11/2008 | Vora | H01L 21/761 257/272 |
| 2012/0115330 A1 | 5/2012 | Mukherjee et al. | |

* cited by examiner

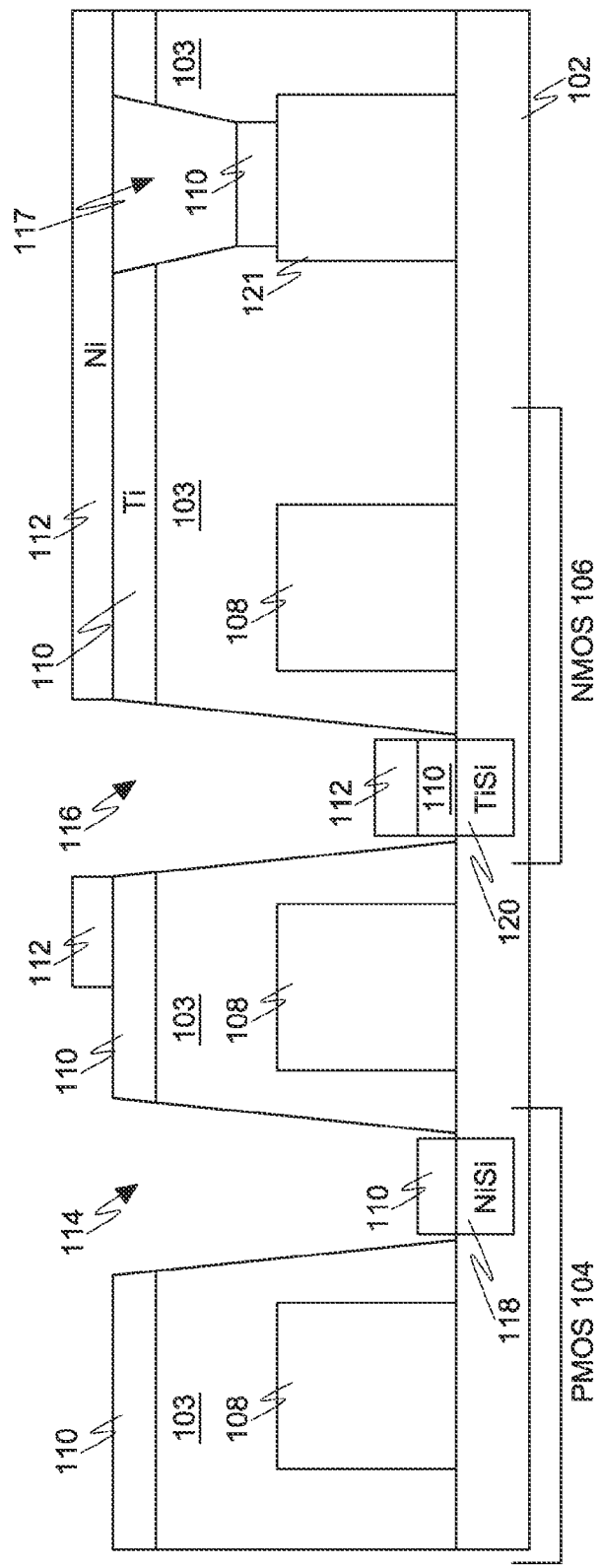

METHODS OF FORMING LOW RESISTANCE CONTACTS

CROSS-REFERENCE TO RELATED APPLICATIONS

This application is a continuation application of U.S. patent application Ser. No. 14/190,226, entitled "METHODS OF FORMING LOW RESISTANCE CONTACTS," filed Feb. 26, 2014, which is incorporated herein by reference in its entirety.

BACKGROUND

In the manufacturing of integrated circuits (ICs), devices such as transistors, diodes, and resistors may be formed on a wafer (e.g., a silicon wafer or another semiconductor wafer) and connected together using one or more metallization layers. The one or more metallization layers may include vias and interconnects, as are well known in the art, that function as electrical connections to interconnect the devices. Contacts may be used to connect the vias and interconnects to the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a PMOS field effect transistor (FET) and an NMOS FET formed on a semiconductor substrate, where the NMOS and PMOS FETs may each utilize a different silicide material, in accordance with some embodiments.

DETAILED DESCRIPTION

Figure 2A:
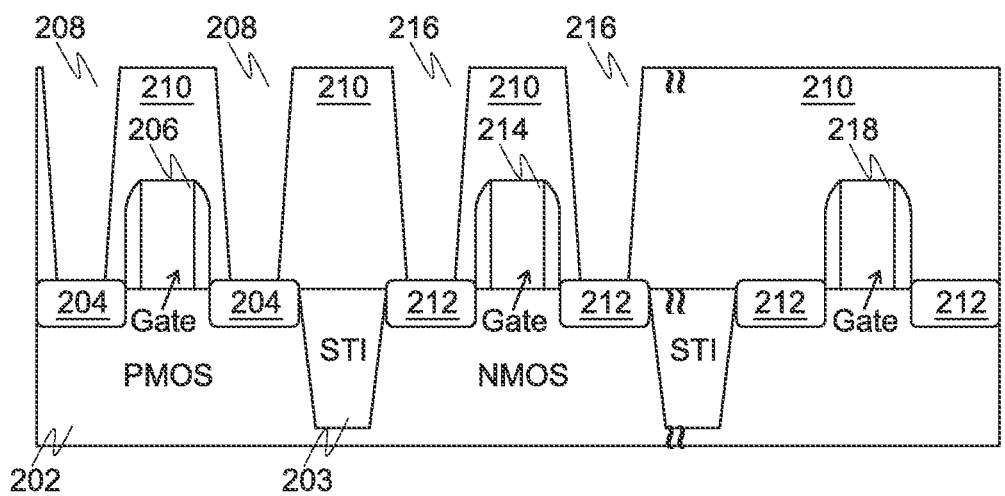
FIG. 2A illustrates a structure including a PMOS FET and an NMOS FET, where openings formed in a dielectric layer may extend to source and drain regions of the FETs, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a PMOS field effect transistor (FET) 104 and an NMOS FET 106 formed on a semiconductor substrate 102, where the NMOS and PMOS FETs 104, 106 may each utilize a different silicide material, in accordance with some embodiments. In the example of FIG. 1, the PMOS FET 104 may include gate regions 108 and a source or drain region 118. Similarly, the NMOS FET 106 may include gate regions 108 and a source or drain region 120. A nickel or nickel-containing silicide layer may be formed over the source or drain region 118 of the PMOS FET 104, and a Titanium silicide layer may be formed over the source or drain region 120 of the NMOS FET 106. In another example, the silicide layer for the PMOS FET 104 may comprise nickel or other additives such as Ti, Al, Co, Pt, or combinations thereof. In yet another example, the silicide layer for the NMOS FET 106 may comprise a metal-insulator-semiconductor (MIS) structure (e.g., including aluminum, titanium dioxide, and silicon) or $TiSi_2$.

In the example of FIG. 1, the silicides formed over the source and drain regions 118, 120 of the PMOS and NMOS FETs 104, 106 may be comprised of different materials (i.e., the silicide for the PMOS FET 104 may be a nickel or nickel-containing layer with additives such as Ti, Al, Co, Pt, or combinations thereof, and the silicide for the NMOS FET 106 may be TiSi or another layer including titanium). Low resistance contacts may be formed using the silicides, where the silicides may be low Schottky barrier height (SBH) silicides. The use of the two different silicide materials for the PMOS and the NMOS FETs 104, 106 may reflect the fact that the silicide Schottky barrier height is generally favorable for one type of MOSFET but unfavorable for the other type. For example, a silicide with a low Schottky barrier height for a PMOS FET (e.g., the PMOS FET 104 of FIG. 1) may have a higher, less desirable Schottky barrier height when used in an NMOS FET (e.g., the NMOS FET 106 of FIG. 1).

The use of the two different silicide materials for the PMOS and NMOS FETs 104, 106 may also be considered in terms of a contact resistance between a contact metal and the source/drain regions 118, 120 of the structure. For example, for the NMOS FET 106, TiSi may be used as the silicide material, and for the PMOS FET 104, NiSi may be used as the silicide material. For the NMOS FET 106, the TiSi silicide may have 2-3 times lower contact resistance (e.g., N+rcsd) as compared to NiSi. By contrast, for the PMOS FET 104, the NiSi may have a lower contact resistance (e.g., P+rcsd) than $TiSi_x$. Thus, in the example of FIG. 1, the two different silicide materials may be selected, where each of the selected materials may be particularly adapted to have a low Schottky barrier height and a low contact resistance for a particular FET type, as described above. Although NiSi and TiSi may be used for the silicides in the example of FIG. 1, in other examples, other combinations of silicide materials may be used. For example, the silicide material for the PMOS FET 104 may generally comprise nickel or a nickel-containing layer with additives such as Ti, Al, Co, Pt, or combinations thereof, and the silicide material for the NMOS FET 106 may generally comprise titanium or a titanium-containing layer with or without additional additives.

The PMOS and NMOS FETs 104, 106 are formed on the semiconductor substrate 102, where the semiconductor substrate 102 may be a silicon substrate in order to form the NiSi and TiSi silicides described above. A dielectric layer 103 may be formed substantially over the semiconductor substrate 102. The dielectric layer 103 may be, for example, an interlayer dielectric (ILD) layer used to isolate components of the FETs 104, 106 from other components formed substantially over the substrate 102 or within the substrate 102. Openings 114, 116 may be etched in the dielectric layer 103. As illustrated in the example of FIG. 1, the openings 114, 116 may extend to the source and drain regions 118, 120 of the PMOS and NMOS FETs 104, 106. In an example, the openings 114, 116 may be contact trenches, and the contact trenches may be used in forming electrical contacts with the source and drain regions 118, 120 of the FETs 104, 106.

In the example of FIG. 1, the different silicides for the PMOS and NMOS FETs 104, 106 may be formed through the contact trenches 114, 116. Thus, in an example, the contact trenches 114, 116 may be etched in the dielectric layer 103, and the silicides may be formed by depositing metal layers within the contact trenches 114, 116. The metal layers deposited within the trenches may comprise different materials, and in the example of FIG. 1, a nickel material may be deposited in the contact trench 114 to form the NiSi silicide, and a titanium material may be deposited in the contact trench 116 to form the TiSi silicide. The metal layers deposited in the contact trenches 114, 116 may be annealed to cause the metal layers to react and form the silicide layers on the source and drain regions 118, 120 of the FETs 104, 106.

FIG. 1 may illustrate other features. For example, a titanium (Ti) layer 110 may be formed substantially over portions of the structure, and a nickel (Ni) layer 112 may be formed substantially over the Ti layer 110. The Ti and Ni layers 110, 112 may be used for various functions, including formation of the silicides, providing an electrical connection to the source and drain regions 118, 120, and providing a metal gate. The use of the Ti layer 110 as a metal gate may be illustrated in FIG. 1, which may include a gate trench 117 that extends to a gate region 121 of the PMOS FET 104 or the NMOS FET 106. In another example, instead of the Ti layer 110, the metal gate may be formed using Ti/TiN or $TiO_2$, and the formation of the metal gate may be integrated with the formation of the NMOS FET 106 silicide. In an example, a low resistance contact for the metal gate may be manufactured together with the NMOS FET 106 contact.

In the example of FIG. 1, a hard mask (not shown in FIG. 1) may be used in forming the dual silicide structure depicted. As explained in further detail below with reference to FIGS. 2A-2L, the hard mask may be deposited over the entire structure and thereafter patterned to remove the hard mask over a single side of the structure. For example, a portion of the hard mask formed over the PMOS FET 104 may be removed, while a second portion of the hard mask formed over the NMOS FET 106 may remain on the structure for a period of time. With the patterned hard mask, the NiSi silicide of the PMOS FET 104 may be formed first, and the second portion of the hard mask may prevent the NiSi silicide from forming over portions of the NMOS FET 106. After forming the NiSi silicide of the PMOS FET 104, a remainder of the hard mask may be removed, and the TiSi silicide of the NMOS FET 106 may be formed. In an alternative embodiment, a metal-insulator-semiconductor (MIS) contact may be used instead of the TiSi silicide material (e.g., a MIS contact including aluminum, titanium dioxide, and Si or another combination of metal, insulator, and semiconductor layers).

The hard mask may comprise various materials including $SiO_2$, $Si_3N_4$, or TiN, among others. Further, as described below, the hard mask may be removed using various methods. In an example where the hard mask comprises $SiO_2$ or $Si_3N_4$, the hard mask may be removed by a silicide pre-clean process or by a dedicated hard mask etch process. In an example where the hard mask comprises TiN, the hard mask may be removed by a selective etch process. The selective etch process may be selective to the hard mask to prevent the removal of a silicide layer (e.g., to prevent removal of the NiSi silicide layer).

FIGS. 2A-2L may illustrate an example process for forming low resistance electrical contacts using two different silicide materials. FIG. 2A illustrates a structure including a PMOS FET and an NMOS FET, where openings 208, 216 formed in a dielectric layer 210 may extend to source and drain regions 204, 212 of the FETs, in accordance with some embodiments. In the structure of FIG. 2A, the PMOS FET may include a gate region 206 and source and drain regions 204, and the NMOS FET may include gate regions 214, 218 and source and drain regions 212.

The PMOS and NMOS FETs may be formed adjacent to each other in a semiconductor substrate 202, as depicted in FIG. 2A, and may be separated by an isolation region 203. The semiconductor substrate 202 may comprise a silicon substrate or may include other materials. The isolation region 203 may be, for example, a shallow trench isolation (STI) region formed by etching a trench in the semiconductor substrate 202 and then filling the trench with an insulating material (e.g., silicon dioxide). The PMOS and NMOS FETs may each have a different conductivity type (i.e., the PMOS FET may predominantly utilize holes as charge carriers, while the NMOS FET may predominantly utilize electrons as charge carriers).

A dielectric layer 210 may be formed over the semiconductor substrate 202. The dielectric layer 210 may be, for example, an interlayer dielectric (ILD) layer comprising silicon dioxide or another insulating material. Openings 208, 216 may be etched in the dielectric layer 210. The openings 208, 216 may extend to the source and drain regions 204, 212 of the PMOS and NMOS FETs, as illustrated in FIG. 2A. In an example, the openings 208, 216 are contact trenches that may be used in forming electrical contacts with the source and drain regions 204, 212 of the FETs.

Figure 2B:
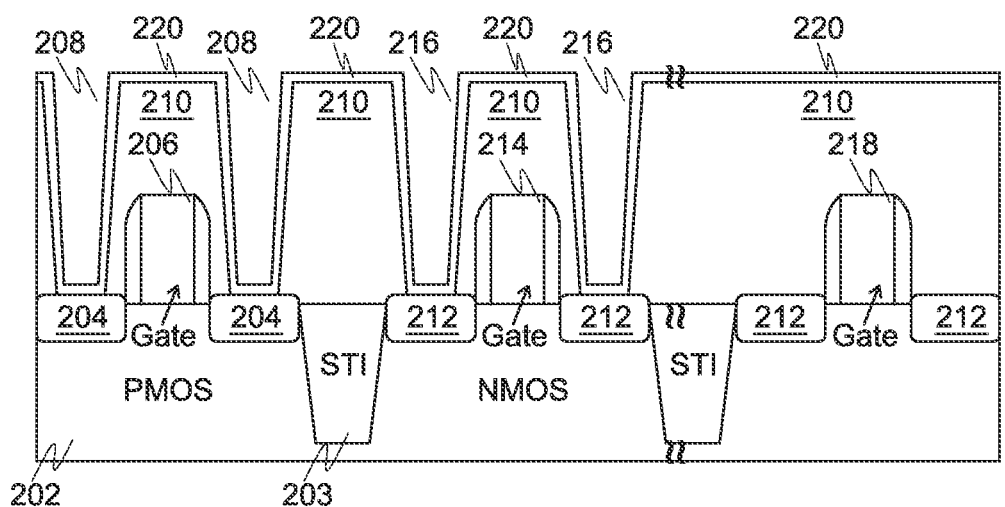
FIG. 2B illustrates a hard mask that may be deposited over the structure, in accordance with some embodiments.

FIG. 2B illustrates a hard mask 220 that may be deposited over the structure, in accordance with some embodiments. As illustrated in FIG. 2B, the hard mask 220 may be formed on the source and drain regions 204, 212 of the FETs, sidewalls of the openings 208, 216, and portions of the dielectric layer 210 that are not inside the openings 208, 216. The hard mask 220 may be comprised of various materials, including $SiO_2$, $Si_3N_4$, and TiN, among others. The hard mask 220 may be deposited via an atomic layer deposition or via another method.

Figure 2C:
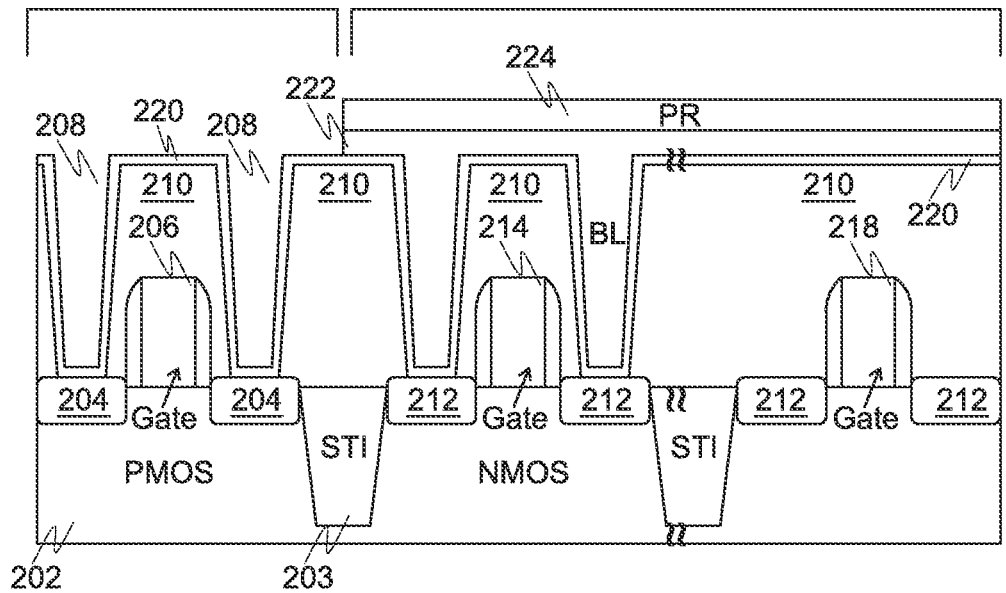
FIG. 2C illustrates photoresist layers that may be used to pattern the hard mask, in accordance with some embodiments.

FIG. 2C illustrates photoresist layers 222, 224 that may be used to pattern the hard mask 220, in accordance with some embodiments. The photoresist layers 222, 224 may include two or three layers, including a bottom layer (BL) 222 with a preferable gap-fill capability and a top layer 224 for patterning. Thus, the gap fill capability of the bottom layer 222 may be better than that of the top layer 224. As illustrated in FIG. 2C, the photoresist layers 222, 224 may be deposited over the hard mask 220 and then patterned. The patterned photoresist layers 222, 224 may include a first portion of the photoresist layers 222, 224 that is formed over a first portion of the hard mask 220 and a second portion of the photoresist layers 222, 224 that is formed over a second portion of the hard mask 220. The first portion of the hard mask 220 may be formed over the PMOS FET, and the second portion of the hard mask 220 may be formed over the NMOS FET. Thus, removing the first portion of the photoresist layers 222, 224 may expose the first portion of the hard mask 220, while the second portion of the hard mask 220 may be shielded by the second portion of the photoresist layers 222, 224.

Figure 2D:
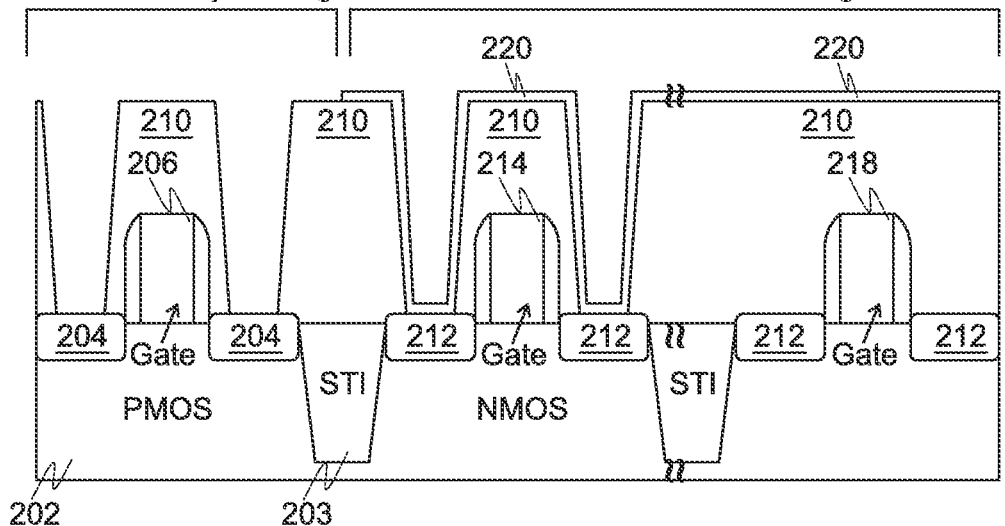
FIG. 2D may illustrate a removal of a first portion of the hard mask via an etching process, in accordance with some embodiments.

FIG. 2D may illustrate a removal of the first portion of the hard mask 220 via an etching process, in accordance with some embodiments. In the etching process, the second portion of the photoresist layers 222, 224 may serve as an etch mask and prevent the removal of the second portion of the hard mask 220 that is substantially over the NMOS FET. By contrast, in the etching process, the first portion of the hard mask 220 that was exposed following the patterning of the photoresist layers 222, 224 may be removed, as illustrated in FIG. 2D.

Figure 2E:
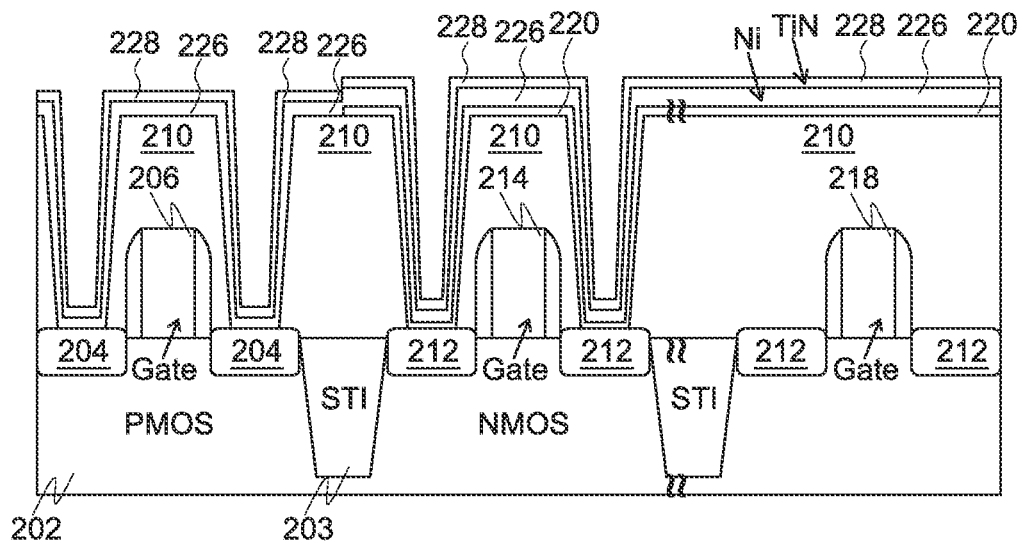
FIG. 2E may illustrate a deposition of a silicide metal layer and a capping layer over the structure, where the silicide metal layer may comprise nickel or a nickel-containing layer (e.g., a nickel-containing layer with additives such as Ti, Al, Co, Pt, or combinations thereof) and may be used in forming first silicide layers on the source and drain regions of the PMOS FET, in accordance with some embodiments.

FIG. 2E may illustrate a deposition of a nickel (Ni) layer 226 and a titanium nitride (TiN) layer 228 over the structure, in accordance with some embodiments. In other examples, a nickel layer may not be used for the layer 226, and instead, other metal-containing layers may be used. The other metal-containing layers may include, for example, a nickel-containing layer with additives such as Ti, Al, Co, Pt, or combinations thereof. Further, in other examples, the layer 228 is a capping layer and may comprise a material other than titanium nitride.

In the example of FIG. 2E, where the layer 226 comprises nickel (Ni) and the layer 228 comprises titanium nitride, the Ni layer 226 may comprise a first metal layer that is used in forming first silicide layers on the source and drain regions 204 of the PMOS FET. As illustrated in FIG. 2E, the Ni layer 226 and the TiN layer 228 may be deposited on the source and drain regions 204 of the PMOS FET and on the second portion of the hard mask 220 that is over the NMOS FET. In an example, a pre-amorphized implantation (PAI) procedure may be performed prior to the deposition of the Ni layer 226, where the PAI procedure may be used to form amorphous silicon in one or more areas of the structure. In an example, a pre-clean procedure may be performed after the PAI procedure but before the deposition of the Ni layer 226, where the pre-clean procedure may prepare the structure for the formation of NiSi silicide layers, as described below.

Figure 2F:
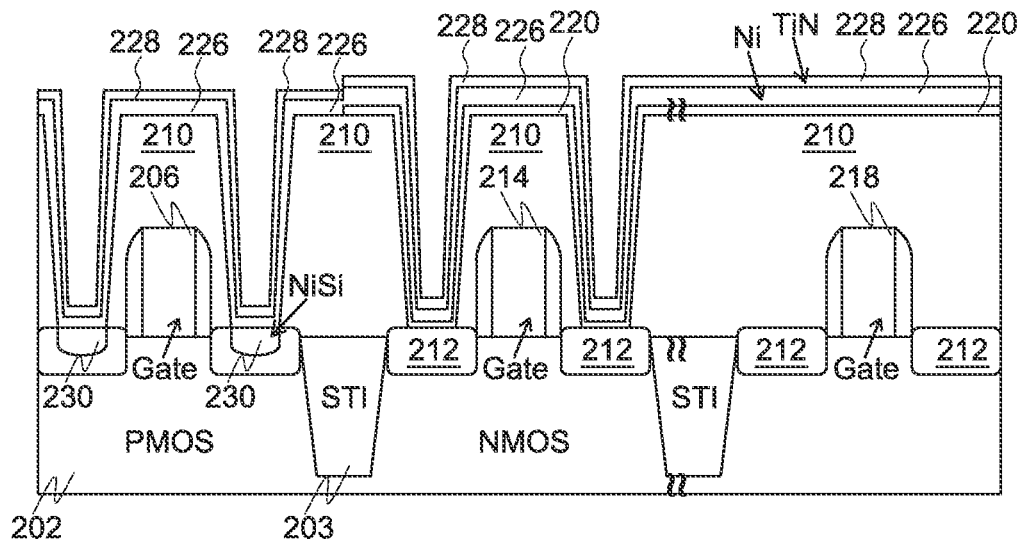
FIG. 2F illustrates use of an annealing process, where the annealing process may be used to form first silicide layers on the source and drain regions of the PMOS FET, in accordance with some embodiments.

FIG. 2F illustrates use of an annealing process, where the annealing process may be used to form first silicide layers 230 on the source and drain regions 204 of the PMOS FET, in accordance with some embodiments. The annealing of the Ni layer 226 may cause the Ni layer 226 to react and form the first silicide layers 230, which may comprise NiSi, as illustrated in FIG. 2F. Various other first silicide layers 230 may be formed, including NiSi and $Ni_2Si$. In the example of FIG. 2F, the second portion of the hard mask 220 that is formed over the NMOS FET may remain on the source and drain regions 212 of the NMOS FET after the removal of the first portion of the hard mask (e.g., as depicted in FIG. 2D). Thus, the Ni layer 226 may be deposited over the second portion of the hard mask 220 (e.g., as depicted in FIG. 2E), and the second portion of the hard mask 220 may prevent formation of the first silicide layers 230 on the source and drain regions 212 of the NMOS FET. The annealing used to form the first silicide layers 230 may be a rapid thermal anneal, in an example.

Figure 2G:
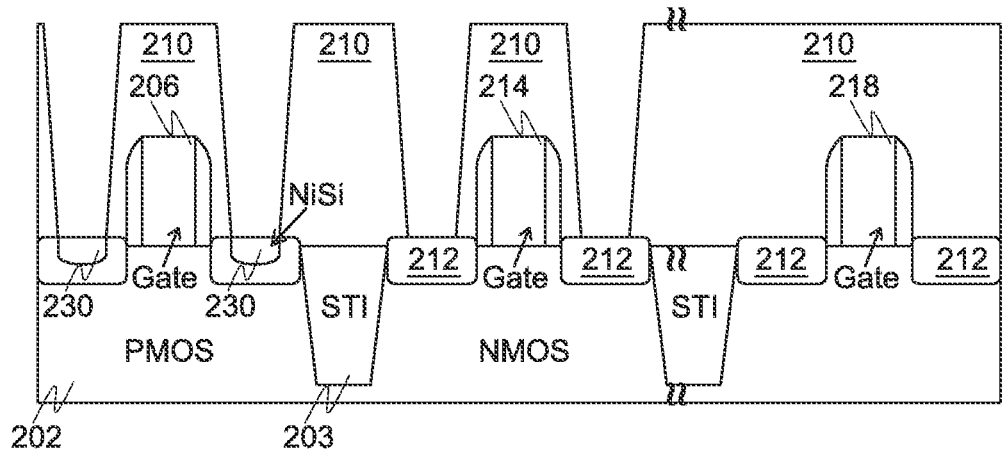
FIG. 2G may illustrate an etch process for removing the nickel or nickel-containing layer, the capping layer, and portions of the hard mask remaining on the structure, in accordance with some embodiments.

FIG. 2G may illustrate an etch process for removing the nickel or nickel-containing layer 226, the capping layer 228, and portions of the hard mask 220 remaining on the structure, in accordance with some embodiments. In FIG. 2G, after the formation of the NiSi silicide layers 230 (e.g., as depicted in FIG. 2F), the Ni layer 226, the TiN layer 228, and the second portion of the hard mask 220 that is formed over the NMOS FET may be removed via an etch process. The etch process may be selective to the Ni layer 226, the TiN layer 228, and the second portion of the hard mask 220 in order to prevent the removal of the NiSi silicide layers 230. Following the removal of the Ni layer 226, the TiN layer 228, and the portions of the hard mask 220 remaining on the structure, an additional annealing process may be performed. In other examples, the additional annealing process may occur later in the process. For example, the additional annealing process may be combined with a subsequent silicidation thermal process that is used to form a TiSi silicide layer (e.g., as described below with reference to FIG. 2J).

Figure 2H:
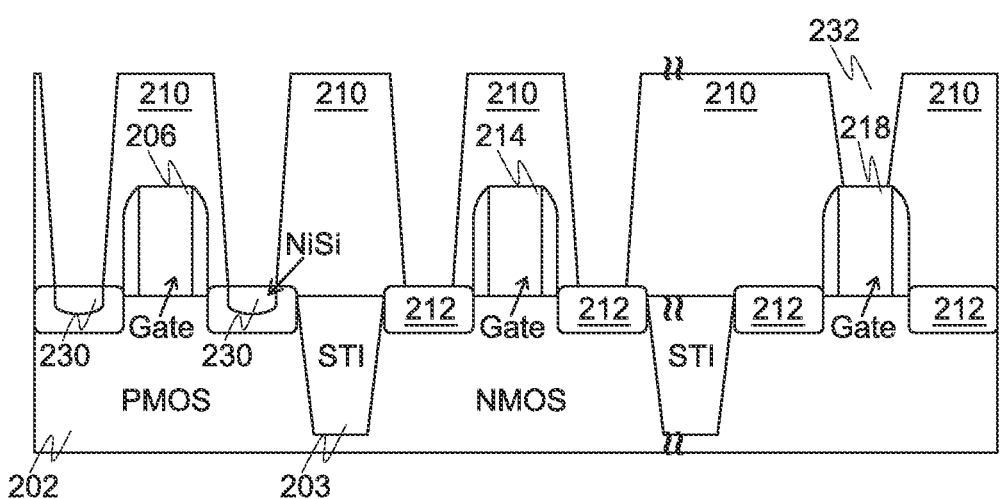
FIG. 2H illustrates a formation of a gate trench that may extend to a gate region of the NMOS FET, in accordance with some embodiments.

FIG. 2H illustrates a formation of a gate trench 232 that may extend to a gate region 218 of the NMOS FET, in accordance with some embodiments. As described above, with reference to FIGS. 2E-2G, the Ni layer 226 may be deposited on the source and drain regions 204 of the PMOS FET and the second portion of the hard mask 220 and then removed after forming the NiSi silicide layers 230. After removing the Ni layer 226, the TiN layer 228, and second portion of the hard mask 220 (e.g., as depicted in FIG. 2G), an additional opening 232 may be etched in the dielectric layer 210 to form a gate trench. The gate trench 232 may extend to the gate region 218, as illustrated in FIG. 2H. The gate trench 232 may be used for forming a metal gate contact. Additionally, in the example of FIG. 2H, a TiSi pre-clean procedure may be performed, where the TiSi pre-clean procedure may prepare the structure for the formation of TiSi silicide layers, as described in further detail below.

Figure 2I:
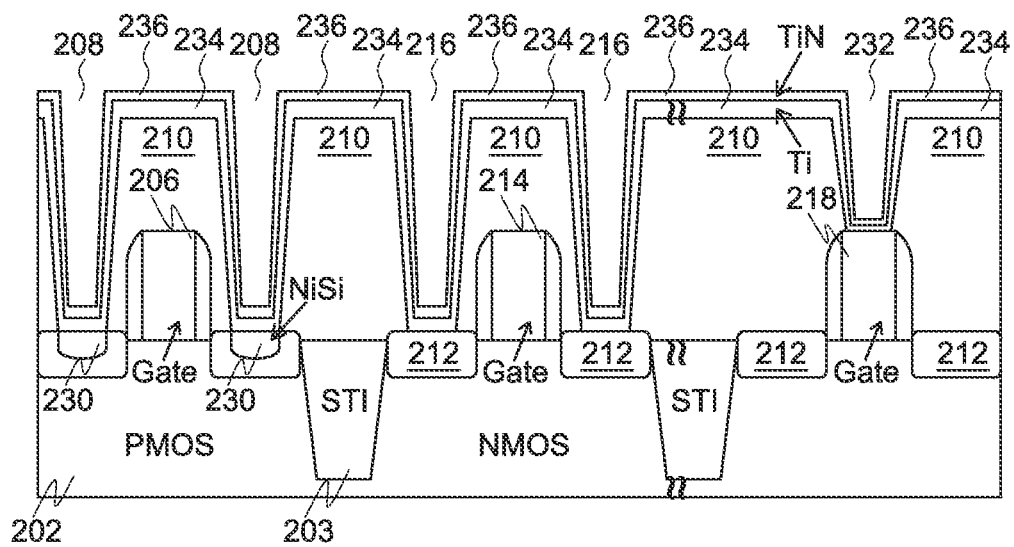
FIG. 2I may illustrate a deposition of a titanium (Ti) layer and a titanium nitride layer (TiN) layer over the structure, where the Ti layer may be used in forming second silicide layers on the source and drain regions of the NMOS FET, in accordance with some embodiments.

FIG. 2I may illustrate a deposition of a titanium (Ti) layer 234 and a titanium nitride layer (TiN) layer 236 over the structure, where the Ti layer 234 may be used in forming second silicide layers on the source and drain regions 212 of the NMOS FET, in accordance with some embodiments. As illustrated in FIG. 2I, following the removal of all portions of the hard mask 220, the Ti layer 234 and the TiN layer 236 may be deposited on the source and drain regions 206 of the PMOS FET (e.g., the source and drain regions 206 of the PMOS FET over which the first silicide layers 230 may be formed), the source and drain regions 212 of the NMOS FET, sidewalls of the openings 208, 216, 232, and portions of the dielectric layer 210 that are not inside of the openings 208, 216, 232.

Figure 2J:
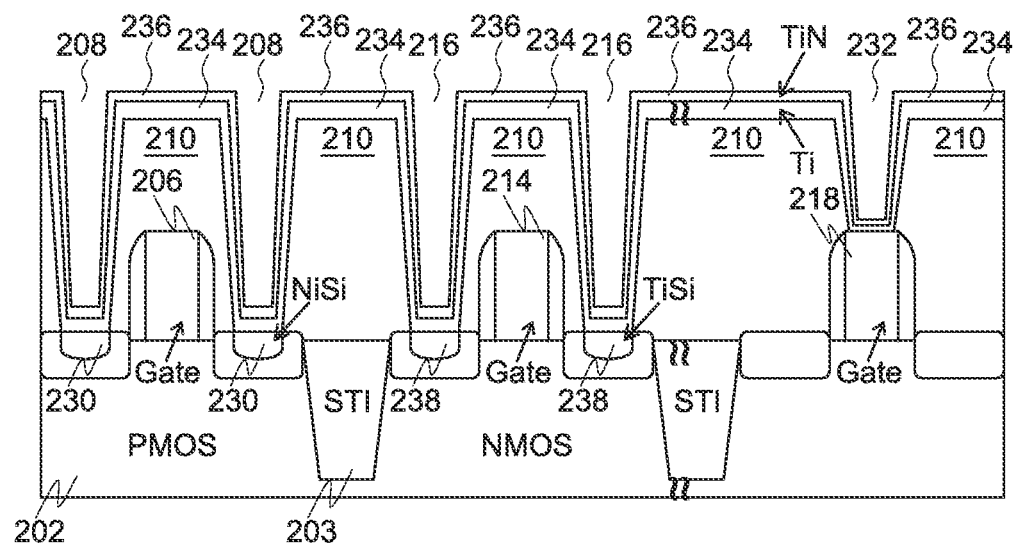
FIG. 2J illustrates use of a second annealing process, where the second annealing process may be used to form second silicide layers on the source and drain regions of the NMOS FET, in accordance with some embodiments.

FIG. 2J illustrates use of a second annealing process, where the second annealing process may be used to form second silicide layers 238 on the source and drain regions 212 of the NMOS FET, in accordance with some embodiments. The annealing of the Ti layer 234 may cause the Ti layer 234 to react and form the second silicide layers 238, which may comprise TiSi, as illustrated in FIG. 2J. Various other second silicide layers 238 may be formed, including $TiSi_2$, among others. The annealing used to form the second silicide layers 238 may be a rapid thermal anneal or a millisecond anneal, in an example. In performing the second anneal, the thermal stability of the first silicide layers 230 (e.g., comprising NiSi) may be considered. As illustrated in the example of FIG. 2J, second silicide layers 238, which may comprise TiSi, may have a different composition than that of the first silicide layers 230, which may comprise NiSi.

Figure 2K:
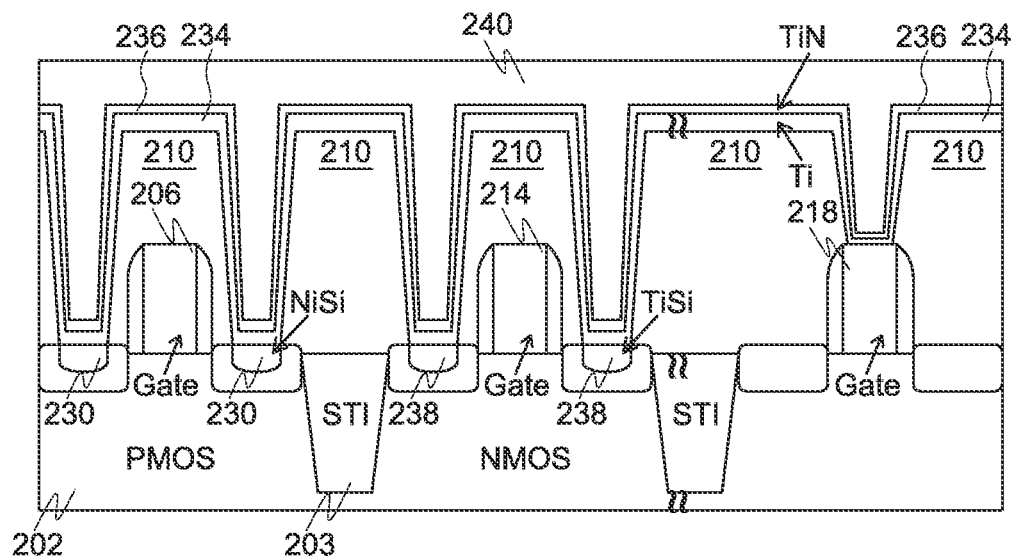
FIG. 2K illustrates a tungsten (W) layer that is used to fill the openings of the structure, where the TiN layer may be used as a barrier layer to prevent the W layer from diffusing into the Ti layer, in accordance with some embodiments.

FIG. 2K illustrates a tungsten (W) layer 240 that is used to fill the openings 208, 216, 232 of the structure, where the TiN layer 236 may be used as a barrier layer to prevent the W layer 240 from diffusing into the Ti layer 234, in accordance with some embodiments. Additionally, the TiN layer 236 may be used as a "glue" layer, where the glue layer may improve an adhesion of the Ti layer 234 to the dielectric layer 210, or the glue layer may improve an adhesion of the W layer 240 to the structure.

Figure 2L:
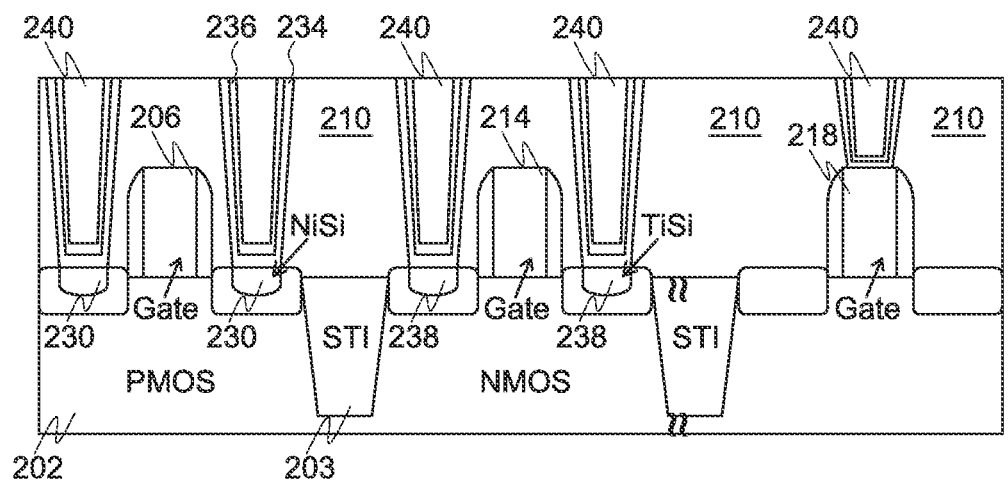
FIG. 2L may illustrate a chemical mechanical planarization (CMP) process for planarizing the structure, in accordance with some embodiments.

FIG. 2L may illustrate a chemical mechanical planarization (CMP) process for planarizing the structure, in accordance with some embodiments. As illustrated in FIG. 2L, the CMP process may remove portions of the Ti layer 234, the TiN layer 236, and the W layer 240. As a result of the process of FIGS. 2A-2L, the W layer 240 may be used to form electrical contacts to the source and drain regions 204, 212 (e.g., the source and drain regions 204, 212 over which the first and second silicide layers 230, 238 may be formed). It is noted that in the example process used to form the electrical contacts, a single hard mask layer may be used (e.g., the hard mask 220) and a single photoresist patterning process may be used (e.g., as depicted in FIG. 2C). The use of the single hard mask layer and the single photoresist patterning process may be in contrast to alternative methods of forming a FET device, which may utilize multiple hard mask layers and more complicated patterning processes.

Figure 3:
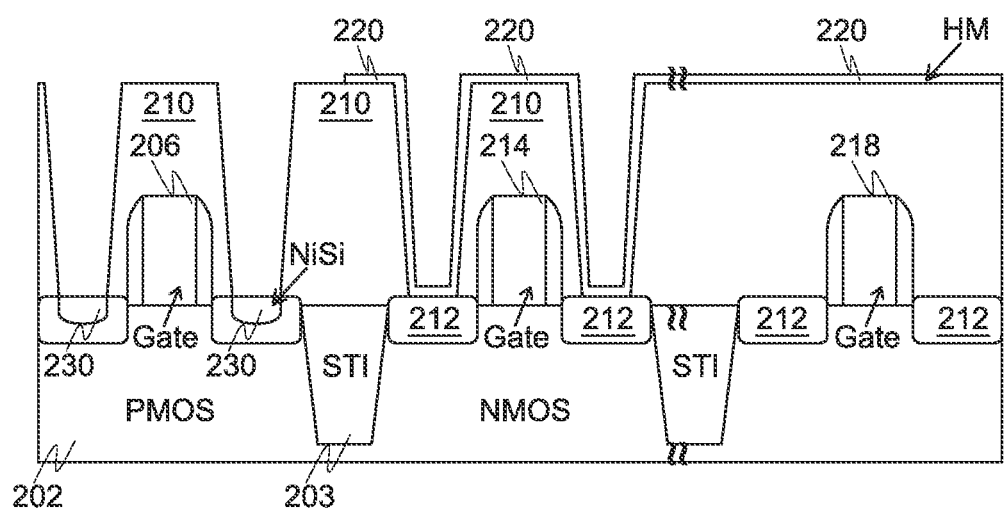
FIG. 3 may illustrate an alternative structure, where the hard mask comprises silicon dioxide ($SiO_2$), in accordance with some embodiments.

FIG. 3 may illustrate an alternative structure, where the hard mask 220 comprises silicon dioxide ($SiO_2$), in accordance with some embodiments. In the example of FIGS. 2A-2L, a FET device may be formed using a TiN hard mask. As described above, however, the hard mask 220 may comprise various other materials, and in the example of FIG. 3, the hard mask 220 may comprise $SiO_2$. Specifically, the example structure of FIG. 3 may correspond to an intermediate step in the fabrication of a FET device that corresponds to the intermediate step presented in FIG. 2G. In FIG. 3, after the formation of the NiSi silicide layers 230 (e.g., as depicted in FIG. 2F), the Ni layer 226 and the TiN layer 228 may be removed via an etch process. The etch process may be selective to the Ni layer 226 and the TiN layer 228 in order to prevent the removal of the NiSi silicide layers 230. The example intermediate step of FIG. 3 may be in contrast to the example intermediate step of FIG. 2G because in FIG. 3, the selective etch process may not remove the $SiO_2$ hard mask 220 (e.g., in contrast to the example of FIG. 2G, where the selective etch process removed the TiN hard mask 220).

After the removal of the Ni layer 226 and the TiN layer 228, a pre-Ti/TiN deposition cleaning may be performed (e.g., where the pre-Ti/TiN deposition cleaning may be performed prior to the depositing of the Ti layer 234 and the TiN layer 236, as depicted in FIG. 2I). Following the pre-Ti/TiN deposition cleaning, the $SiO_2$ hard mask 220 may be removed. Before the removal of the $SiO_2$ hard mask 220, an additional opening 232 may be etched in the dielectric layer 210 to form a gate trench (e.g., a gate trench similar to the gate trench 232 depicted in FIG. 2H).

Figure 4:
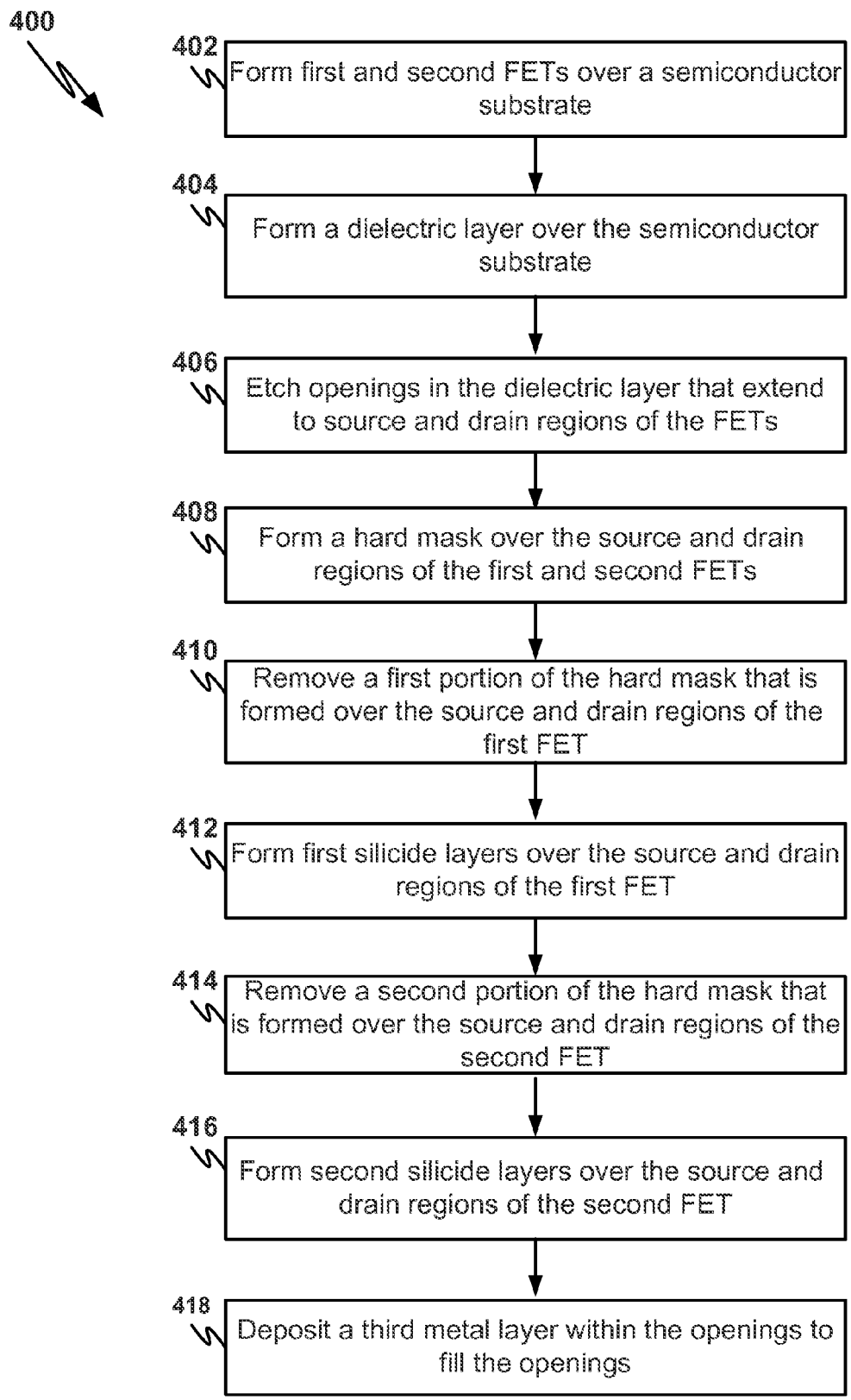
FIG. 4 is a flowchart that may illustrate an example method for forming low resistance electrical contacts, in accordance with some embodiments.

FIG. 4 is a flowchart 400 that may illustrate an example method for forming low resistance electrical contacts, in accordance with some embodiments. At 402, first and second field effect transistors (FETs) may be formed over a semiconductor substrate, where the second FET may have a different conductivity type than the first FET. At 404, a dielectric layer may be formed over the semiconductor substrate. At 406, openings may be etched in the dielectric layer that extend to i) source and drain regions of the first FET, and ii) source and drain regions of the second FET. At 408, a hard mask may be formed over the source and drain regions of the first and second FETs. At 410, a first portion of the hard mask may be removed, where the first portion may be formed over the source and drain regions of the first FET. At 412, after removing the first portion of the hard mask, first silicide layers may be formed over the source and drain regions of the first FET. The first silicide layers may be formed by depositing a first metal layer over the source and drain regions of the first FET and annealing the first metal layer to cause the first metal layer to react and form the first silicide layers. At 414, after forming the first silicide layers, a second portion of the hard mask may be removed, where the second portion may be formed over the source and drain regions of the second FET. At 416, after removing the second portion of the hard mask, second silicide layers may be formed over the source and drain regions of the second FET. The second silicide layers may be formed by depositing a second metal layer over the source and drain regions of the second FET and annealing the second metal layer to cause the second metal layer to react and form the second silicide layers. At 418, a third metal layer may be deposited within the openings to fill the openings.

Figure 5:
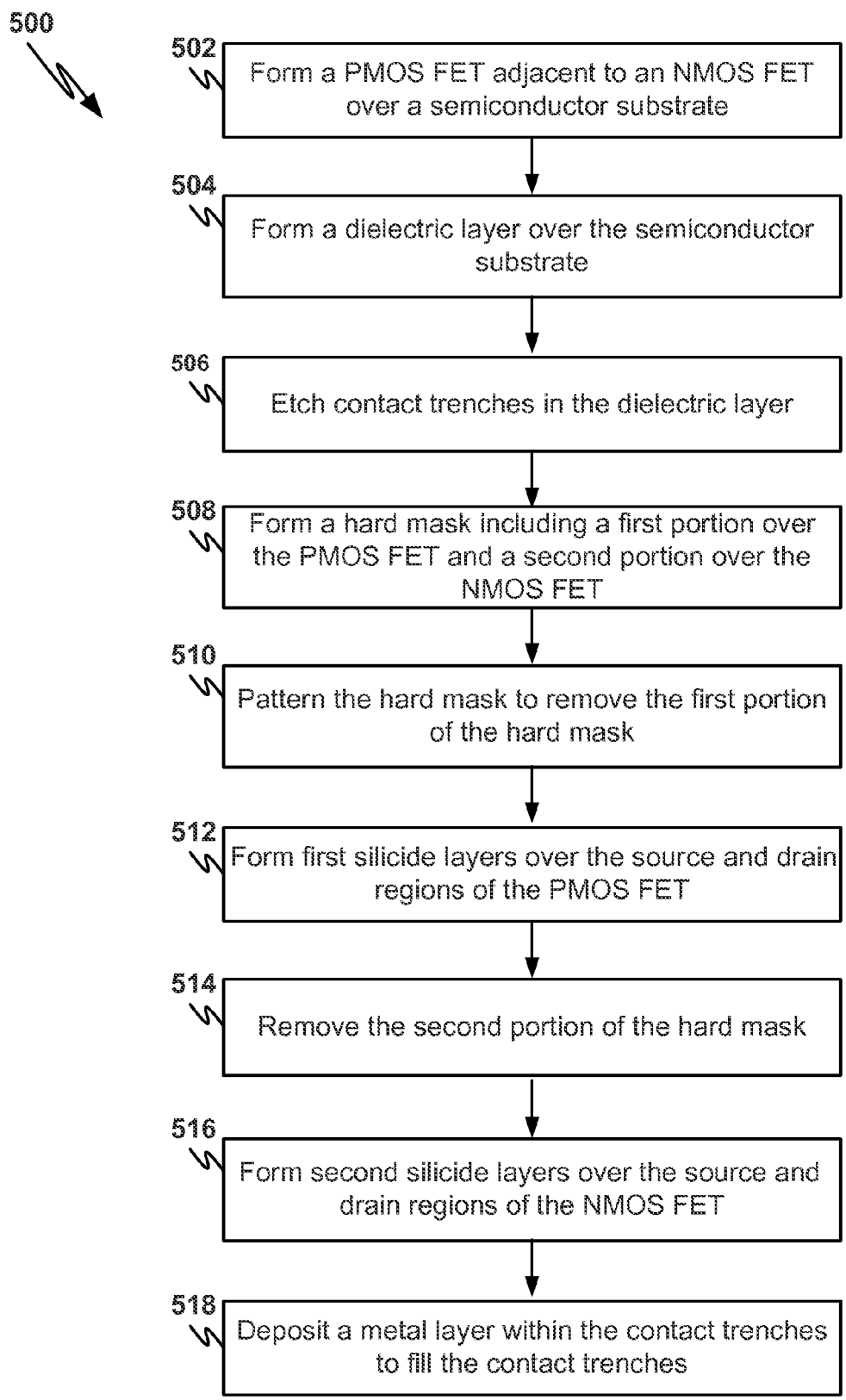
FIG. 5 is a flowchart that may illustrate another example method for forming low resistance electrical contacts, in accordance with some embodiments.

FIG. 5 is a flowchart 500 that may illustrate another example method for forming low resistance electrical contacts, in accordance with some embodiments. At 502, a PMOS field effect transistor (FET) may be formed adjacent to an NMOS FET over a semiconductor substrate, where an isolation region may separate the PMOS FET and the NMOS FET. At 504, a dielectric layer may be formed over the semiconductor substrate. At 506, contact trenches may be etched in the dielectric layer that extend to i) source and drain regions of the PMOS FET, and ii) source and drain regions of the NMOS FET. At 508, a hard mask may be formed that includes a first portion formed over the PMOS FET and a second portion formed over the NMOS FET. At 510, the hard mask may be patterned to remove the first portion of the hard mask. At 512, first silicide layers may be formed over the source and drain regions of the PMOS FET. The second portion of the hard mask may prevent the first silicide layers from forming over the source and drain regions of the NMOS FET. At 514, the second portion of the hard mask may be removed. At 516, second silicide layers may be formed over the source and drain regions of the NMOS FET. At 518, a metal layer may be deposited within the contact trenches to fill the contact trenches.

The present disclosure is directed to a manufacturing method of forming low resistance contacts on PMOS and NMOS FETs. As described above, the manufacturing method may employ single-side active area patterning, thus causing a hard mask to be formed on one single side of a structure that includes the PMOS and NMOS FETs. Using the hard mask to mask the NMOS FET, silicides comprising a first silicide material may first be formed over the PMOS FET. Subsequently, the hard mask may be removed, and silicides comprising a second, different silicide material may be formed over the NMOS FET. The silicides may be formed through a contact structure (e.g., through contact trenches, as described herein) and may allow for lower contact resistance in the PMOS and NMOS FETs, due to the two different silicide materials that may be used.

The present disclosure is directed to a field effect transistor (FET) device and methods for forming electrical contacts. In an embodiment of a method for forming electrical contacts, first and second field effect transistors (FETs) are formed over a semiconductor substrate, where the second FET has a different conductivity type than the first FET. A dielectric layer is formed over the semiconductor substrate. Openings are etched in the dielectric layer that extend to i) source and drain regions of the first FET, and ii) source and drain regions of the second FET. A hard mask is formed over the source and drain regions of the first and second FETs. A first portion of the hard mask is removed, where the first portion is formed over the source and drain regions of the first FET. After removing the first portion of the hard mask, first silicide layers are formed over the source and drain regions of the first FET. The first silicide layers are formed by depositing a first metal layer over the source and drain regions of the first FET and annealing the first metal layer to cause the first metal layer to react and form the first silicide layers. After forming the first silicide layers, a second portion of the hard mask is removed, where the second portion is formed over the source and drain regions of the second FET. After removing the second portion of the hard mask, second silicide layers are formed over the source and drain regions of the second FET. The second silicide layers are formed by depositing a second metal layer over the source and drain regions of the second FET and annealing the second metal layer to cause the second metal layer to react and form the second silicide layers. A third metal layer is deposited within the openings to fill the openings.

In another embodiment of a method for forming electrical contacts, a PMOS field effect transistor (FET) is formed adjacent to an NMOS FET over a semiconductor substrate, where an isolation region separates the PMOS FET and the NMOS FET. A dielectric layer is formed over the semiconductor substrate. Contact trenches are etched in the dielectric layer that extend to i) source and drain regions of the PMOS FET, and ii) source and drain regions of the NMOS FET. A hard mask is formed that includes a first portion formed over the PMOS FET and a second portion formed over the NMOS FET. The hard mask is patterned to remove the first portion of the hard mask. First silicide layers are formed over the source and drain regions of the PMOS FET. The second portion of the hard mask prevents the first silicide layers from forming over the source and drain regions of the NMOS FET. The second portion of the hard mask is removed. Second silicide layers are formed over the source and drain regions of the NMOS FET. A metal layer is deposited within the contact trenches to fill the contact trenches.

In an embodiment of a FET device, the FET device includes a semiconductor substrate. First and second FETs are formed over the semiconductor substrate, where the second FET has a different conductivity type than the first FET. The first and second FETs include a dielectric layer formed over the semiconductor substrate. The dielectric layer includes openings that extend to source and drain regions of the first FET and source and drain regions of the second FET. The first and second FETs also include first silicide layers formed over the source and drain regions of the first FET. The first silicide layers are formed by forming a hard mask over the source and drain regions of the first and second FETs, removing a first portion of the hard mask that is formed over the source and drain regions of the first FET, depositing a first metal layer over the source and drain regions of the first FET, and annealing the first metal layer to cause the first metal layer to react and form the first silicide layers. The first and second FETs also includes second silicide layers formed over the source and drain regions of the second FET. The second silicide layers are formed by removing a second portion of the hard mask that is formed over the source and drain regions of the second FET, depositing a second metal layer over the source and drain regions of the second FET, and annealing the second metal layer to cause the second metal layer to react and form the second silicide layers. A third metal layer is deposited within the openings to fill the openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming electrical contacts, the method comprising:
    forming first and second field effect transistors (FETs) over a semiconductor substrate;
    forming a dielectric layer over the semiconductor substrate;
    etching openings in the dielectric layer that extend to i) source and drain regions of the first FET, and ii) source and drain regions of the second FET;
    forming a hard mask over the source and drain regions of the first and second FETs;
    removing a first portion of the hard mask, wherein the first portion is formed over the source and drain regions of the first FET;
    forming first silicide layers over the source and drain regions of the first FET by depositing a first metal layer over the source and drain regions of the first FET, and annealing the first metal layer to cause the first metal layer to react and form the first silicide layers;
    removing a second portion of the hard mask, wherein the second portion is formed over the source and drain regions of the second FET;
    forming second silicide layers over the source and drain regions of the second FET, wherein the second silicide layers are formed by depositing a second metal layer over the source and drain regions of the second FET, and annealing the second metal layer to cause the second metal layer to react and form the second silicide layers; and
    depositing a third metal layer within the openings to fill the openings.

2. The method of claim 1, wherein the first portion of the hard mask that is formed over the source and drain regions of the first FET is removed by:
    depositing a photoresist layer over the hard mask;
    patterning the photoresist layer, such that a first portion of the photoresist layer formed over the first portion of the hard mask is removed, and a second portion of the photoresist layer formed over the second portion of the hard mask is not removed; and
    etching the hard mask, wherein the first portion of the hard mask is removed by the etching, and wherein the second portion of the photoresist layer prevents the second portion of the hard mask from being removed.

3. The method of claim 1, wherein the second portion of the hard mask remains over the source and drain regions of the second FET after the removal of the first portion of the hard mask, wherein the first metal layer is deposited over the second portion of the hard mask that remains over the source and drain regions of the second FET, and wherein the second portion of the hard mask prevents formation of the first silicide layers over the source and drain regions of the second FET.

4. The method of claim 1, wherein the third metal layer forms the electrical contacts to the source and drain regions of the first and second FETs, and wherein the first and second silicide layers are formed prior to the depositing of the third metal layer.

5. The method of claim 1, wherein the hard mask is formed over i) the source and drain regions of the first and second FETs, ii) sidewalls of the openings, and iii) portions of the dielectric layer that are not inside the openings, and wherein a second hard mask is not utilized in forming the first and second silicide layers.

6. The method of claim 1, wherein the openings are contact trenches for forming the electrical contacts to the source and drain regions of the first and second FETs.

7. The method of claim 1, wherein forming first and second field effect transistors (FETs) over the semiconductor substrate further comprises forming a PMOS FET and a NMOS FET over a silicon substrate.

8. The method of claim 7, wherein depositing the first metal layer over the source and drain regions of the first FET further comprises depositing the first metal layer comprising nickel, and wherein forming the first silicide layers over the source and drain regions of the first FET further comprises forming the first silicide layers comprising NiSi.

9. The method of claim 8, further comprising:
    depositing the first metal layer over the source and drain regions of the first FET and the second portion of the hard mask comprising titanium nitride (TiN); and
    after forming the first silicide layers over the source and drain regions of the first FET, removing i) the first metal layer, and ii) the second portion of the hard mask via an etch process that is selective to the first metal layer and the second portion of the hard mask to prevent the removal of the first silicide layers.

10. The method of claim 8, further comprising:
    depositing the first metal layer over the source and drain regions of the first FET and the second portion of the hard mask; and
    after forming the first silicide layers over the source and drain regions of the first FET, removing the first metal layer via an etch process that is selective to the first metal layer to prevent the removal of the first silicide layers, wherein the etch process does not remove the hard mask comprising silicon dioxide (SiO).

11. The method of claim 7, wherein depositing the second metal layer over the source and drain regions of the second FET further comprises depositing the second metal layer comprising titanium, and wherein forming the second silicide layers over the source and drain regions of the second FET further comprises forming the second silicide layers comprising TiSi.

12. The method of claim 1, further comprising:
    after forming the first silicide layers:
        removing an entirety of the hard mask that has not previously been removed;
        depositing the second metal layer over i) the source and drain regions of the first FET, ii) the source and drain regions of the second FET, iii) sidewalls of the openings, and iv) portions of the dielectric layer that are not inside the openings;
        depositing the third metal layer over the second metal layer; and
        performing a chemical mechanical planarization (CMP) process, wherein the CMP process removes portions of the second metal layer and the third metal layer.

13. The method of claim 1, wherein forming the second silicide layers over the source and drain regions of the second FET further comprises forming the second silicide layers by using a material or compound that has a different composition than a material or compound of the first silicide layers.

14. The method of claim 1, further comprising:
    depositing the first metal layer over the source and drain regions of the first FET and the second portion of the hard mask;
    after forming the first silicide layers, removing the first metal layer;

after removing the first metal layer, etching an additional opening in the dielectric layer to form a gate trench that extends to a gate region of the first FET or the second FET; and after etching the additional opening, depositing the second metal layer and forming the second silicide layers.

15. A method for forming electrical contacts, the method comprising:

forming a PMOS field effect transistor (FET) adjacent to an NMOS FET over a semiconductor substrate;

forming a dielectric layer over the semiconductor substrate;

etching contact trenches in the dielectric layer that extend to i) source and drain regions of the PMOS FET, and ii) source and drain regions of the NMOS FET;

forming a hard mask including a first portion formed over the PMOS FET and a second portion formed over the NMOS FET;

patterning the hard mask to remove the first portion of the hard mask;

forming first silicide layers over the source and drain regions of the PMOS FET, wherein the second portion of the hard mask prevents the first silicide layers from forming over the source and drain regions of the NMOS FET;

removing the second portion of the hard mask;

forming second silicide layers over the source and drain regions of the NMOS FET; and depositing a metal layer within the contact trenches to fill the contact trenches.

16. A method for forming electrical contacts, the method comprising:

forming first and second field effect transistors (FETs) over a semiconductor substrate;

forming a dielectric layer with openings extend to i) source and drain regions of the first FET, and ii) source and drain regions of the second FET over the semiconductor substrate;

forming a hard mask over the source and drain regions of the first and second FETs;

removing a first portion of the hard mask, wherein the first portion is formed over the source and drain regions of the first FET;

forming first silicide layers over the source and drain regions of the first FET, wherein the first silicide layers are formed by depositing a first metal layer over the source and drain regions of the first FET, and annealing the first metal layer to cause the first metal layer to react and form the first silicide layers;

removing a second portion of the hard mask, wherein the second portion is formed over the source and drain regions of the second FET;

forming second silicide layers over the source and drain regions of the second FET, wherein the second silicide layers are formed by depositing a second metal layer over the source and drain regions of the second FET, and annealing the second metal layer to cause the second metal layer to react and form the second silicide layers; and depositing a third metal layer within the openings to fill the openings.

17. The method of claim 16, wherein the first portion of the hard mask that is formed over the source and drain regions of the first FET is removed by:

depositing a photoresist layer over the hard mask;

patterning the photoresist layer, such that a first portion of the photoresist layer formed over the first portion of the hard mask is removed, and a second portion of the photoresist layer formed over the second portion of the hard mask is not removed; and etching the hard mask, wherein the first portion of the hard mask is removed by the etching, and wherein the second portion of the photoresist layer prevents the second portion of the hard mask from being removed.

18. The method of claim 16, wherein the second portion of the hard mask remains over the source and drain regions of the second FET, wherein the first metal layer is deposited over the second portion of the hard mask that remains over the source and drain regions of the second FET, and wherein the second portion of the hard mask prevents formation of the first silicide layers over the source and drain regions of the second FET.

19. The method of claim 16, wherein the third metal layer forms the electrical contacts to the source and drain regions of the first and second FETs, and wherein the first and second silicide layers are formed prior to the depositing of the third metal layer.

20. The method of claim 16, wherein the hard mask is formed over i) the source and drain regions of the first and second FETs, ii) sidewalls of the openings, and iii) portions of the dielectric layer that are not inside the openings, and wherein a second hard mask is not utilized in forming the first and second silicide layers.

* * * * *